United States Patent
Utsumi et al.

(10) Patent No.: US 6,818,328 B2
(45) Date of Patent: Nov. 16, 2004

(54) COLOR CONVERSION FILTER SUBSTRATE, COLOR CONVERSION TYPE MULTICOLOR ORGANIC EL DISPLAY HAVING THE COLOR CONVERSION FILTER SUBSTRATE, AND METHODS OF MANUFACTURING THESE

(75) Inventors: Makoto Utsumi, Kanagawa (JP); Koji Kawaguchi, Kanagawa (JP)

(73) Assignee: Fuji Electric Co., Ltd., Kawasaki (JP)

( * ) Notice: Subject to any disclaimer, the term of this patent is extended or adjusted under 35 U.S.C. 154(b) by 14 days.

(21) Appl. No.: 10/368,357

(22) Filed: Feb. 20, 2003

(65) Prior Publication Data

US 2004/0166362 A1 Aug. 26, 2004

(51) Int. Cl.[7] ............................ H05B 33/22; B05D 5/12; B32B 7/02
(52) U.S. Cl. ...................... 428/690; 428/212; 428/917; 427/66; 313/112; 313/504; 257/98
(58) Field of Search ................................. 428/690, 917, 428/212; 427/66; 313/112, 504; 257/98

(56) References Cited

U.S. PATENT DOCUMENTS 5,869,929 A * 2/1999 Eida et al. .................. 313/501

6,163,110 A * 12/2000 Arai ............................ 313/503

FOREIGN PATENT DOCUMENTS

| JP | 7-146480 | 6/1995 |
|----|----------|--------|
| JP | 8-279394 | 10/1996 |
| JP | 10-10518 | 1/1998 |

* cited by examiner

Primary Examiner—Dawn Garrett
(74) Attorney, Agent, or Firm—Manabu Kanesaka (57) ABSTRACT

A color conversion filter substrate includes a transparent support substrate; color conversion filter layers formed of a resin film containing a fluorescent colorant and formed on the support substrate in a desired pattern; a polymeric film layer formed of a transparent material for covering the support substrate and having a flat surface; a transparent inorganic film layer formed on the polymeric film layer; and a transparent electrode layer formed on the inorganic film layer. The inorganic film layer is formed of a single layer, and has a refractive index n smaller than that of the transparent electrode layer with respect to light with a wavelength $\lambda$ in a range from 450 nm to 500 nm, and has a thickness d defined by $nd = s\lambda/2$, wherein s is a natural number.

17 Claims, 3 Drawing Sheets

COLOR CONVERSION FILTER SUBSTRATE, COLOR CONVERSION TYPE MULTICOLOR ORGANIC EL DISPLAY HAVING THE COLOR CONVERSION FILTER SUBSTRATE, AND METHODS OF MANUFACTURING THESE

BACKGROUND OF THE INVENTION AND RELATED ART STATEMENT

The present invention relates to a color conversion filter substrate with good environmental resistance and high productivity for displaying multiple colors with high definition, and to an organic multicolor emitting display device provided with such a filter substrate. More specifically, the present invention relates to a color conversion filter substrate and an organic multicolor emitting display device provided with such a filter substrate for a display of electronic and electric equipment such as an image sensor, a personal computer, a word processor, a television, a fax machine, an audio equipment, a video equipment, a car navigation system, an electric desk top calculator, a telephone, a portable terminal, or an industrial instrument. Especially, the present invention relates to an organic multicolor emitting display device using a color conversion method.

In recent years, the information technology has been diversified. Display devices including solid imaging devices in the information technology have been required to have a better aesthetic appearance, a lighter weight, a thinner thickness and higher performance. A great effort has been made to reduce power consumption and increase a response speed. In particular, many attempts have been made to develop high-definition full-color display devices.

In the second half of the 1980s, an organic electroluminescence (hereinafter referred to as 'organic EL') device with an organic molecule thin-layered structure has been developed as a device having higher contrast, constant-voltage driving, wider angle visibility, and faster response as opposed to a liquid crystal display device. Tang et al. reported that an organic EL formed of stacked thin films of organic molecules showed a high luminance of 1000 cd/m$^2$ at an applied voltage of 10 V (Appl. Phys. Lett., 51, 913 (1987)). This stacked organic EL luminous device has excellent characteristics such as a wide view angle and a quick response time compared to liquid crystal display devices. After the report by Tang et al., a great effort has been made to develop organic EL luminous devices for a practical use. Attempts have also been made to develop similar devices composed of an organic polymer material.

Since the organic EL luminous device provides a high current density at a low voltage, it is expected to provide higher emission luminance and efficiency as opposed to inorganic EL luminous devices and LEDs. The organic EL display device is expected to have characteristics such as (1) high luminance and high contrast, (2) low driving voltage and high emission efficiency, (3) high resolution, (4) wide angle visibility, (5) high response speed, (6) possibility of increasing definition and providing color displays, (7) reduced weight and reduced thickness, and the like. Thus, the organic EL luminous device is expected to have a better aesthetic appearance, a lighter weight, a thinner thickness and higher performance.

Tohoku Pioneer Corporation has already developed products including vehicle-mounted green monochrome organic EL displays since November 1997. In order to meet the society needs, it is desirable to develop improved organic EL displays that are stable for an extended period of time, respond quickly, and display multiple colors or full colors with high definition.

There have been three major approaches as a method of displaying multiple or full colors with the organic EL display. One of the methods was disclosed in Japanese Patent Publications No. 57-167487, No. 58-147989, and No. 03-214593, in which light emitting elements of the three primary colors (red, green, and blue) are arranged in a matrix form. In this method, it is necessary to arrange three types of light-emitting materials (R, G, and B) in a matrix form with high precision, thereby making it technically difficult to produce and increasing a cost. Further, the three types of light-emitting materials have different life times, thereby shifting a color of the display with time.

As the second approach, in Japanese Patent Publications No. 01-315988, No. 02-273496, and No. 03-194895, a method in which a color filter and a backlight emitting white light are used to display the three primary colors through the filter was disclosed. However, it is difficult to obtain an organic light emitting device emitting the bright white light with a long life, which is necessary for obtaining bright three colors R, G, and B.

As the third approach, in recent years, a color conversion method has been proposed in which a filter is composed of a fluorescent material for absorbing light with a wavelength in a light-emission region of an organic light emitting device, so that the fluorescent material emits fluorescence with a wavelength in a visible light region (Japanese Patent Publications No. 03-152897 and No. 05-258860). In this approach, an organic light emitting device that emits a color other than white can be used. Therefore, it is possible to use an organic light emitting device with higher brightness as a light source. In a color conversion method using an organic light emitting device emitting blue light (Japanese Patent Publications No. 03-152897, No. 08-286033, and No. 09-208944), a frequency of blue light is converted to that of green or red light. A color conversion filter containing a fluorescent material with such color conversion effect may be formed in a high-resolution pattern. Accordingly, it is possible to provide a full-color light emitting display even with weak energy light such as near-ultraviolet light or visible light.

In order to form a pattern of a color conversion filter, a method in which a pattern is formed with a photolithography process after a film of a resist (photosensitive polymer) material containing fluorescent material is prepared by spin-coating has been disclosed in Japanese Patent Publications No. 05-198921 and No. 05-258860. Also, Japanese Patent Publication No. 09-208944 has disclosed a process in which a fluorescent material or fluorescent pigment is dispersed in a basic binder followed by etching the binder with an acid solution.

In general, it is important for a practical color display to possess high-resolution color and long-term stability (as described in Kinohzairyo Vol. 18, No. 2, 96). However, the organic EL luminous devices tend to markedly lose light-emission characteristics such as current-luminance characteristics after a specific period of time.

A major cause of the degraded light-emission characteristics is a growth of dark spots in the light-emitting layer. The dark spots are formed of light-emission defects. When the fluorescent material in the light-emitting layer is oxidized while using or storing the organic EL luminous device, the dark spots grow and spread over the entire light-emitting surface. It is believed that the dark spots are created by oxidation or aggregation of a material constituting a layered device caused by oxygen or moisture in the device. The dark spots grow not only when electricity is conducted but also during storage. In particular, it is believed that (1) the growth is accelerated by oxygen or moisture present around the device, (2) the growth is affected by oxygen or moisture attached to the organic stacked films, and (3) the growth is affected by moisture attached to parts or entered in the device when the device is manufactured.

Figure 2:
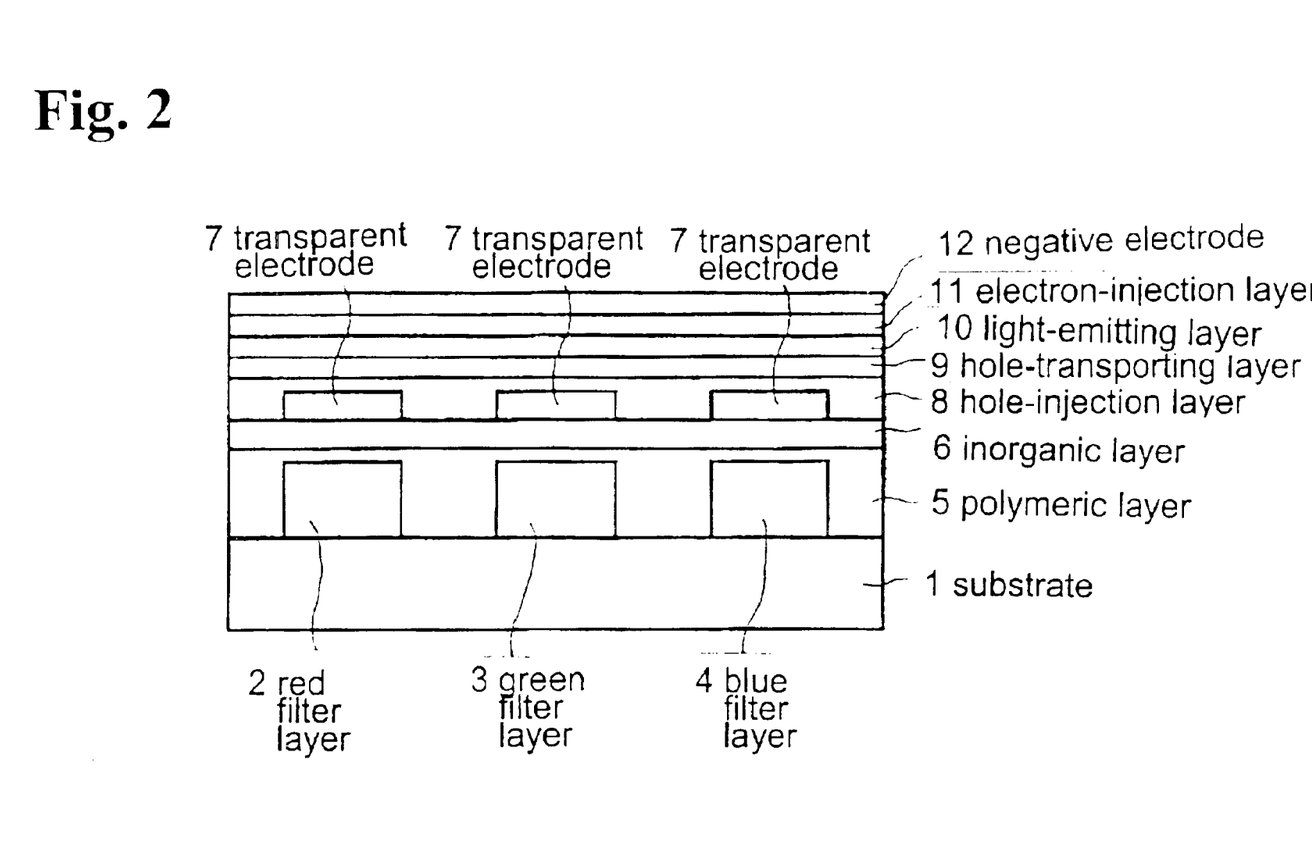
FIG. 2 is a schematic diagram showing a sectional view of an organic EL multicolor display device using a color conversion filter substrate according to the present invention.

As shown in FIG. 2, in the color conversion multicolor organic EL display, the color conversion filters 2, 3, and 4 are disposed under the transparent electrode 7. As described above, the color conversion filter is formed of a resin containing the colorant for color conversion. Because of thermal stability of the colorant, it is not possible to dry the color conversion filter at a temperature above 200° C. Accordingly, it is likely that the color conversion filters contain moisture from a coating liquid or entered during a pattern-forming process. The moisture in the color conversion filters passes through the polymeric layer to the device while the device is stored or is continuously operated, thereby facilitating the growth of the dark spots.

In order to prevent moisture from entering the organic EL luminous device, Japanese Patent Publication No. 08-279394 has disclosed an approach in which an insulating inorganic oxide layer with a thickness of 0.01 to 200 $\mu$m is provided between the color conversion filter layers and the organic EL luminous device. The inorganic oxide layer is required to have high moisture resistance for maintaining the life of the organic light-emitting layer. It is preferable that the inorganic oxide layer has coefficients of the gas permeability for both water vapor and oxygen less than $10^{-13}$ cc·cm/cm$^2$·s·cmHg (according to the gas permeability test method in JIS K7126).

As disclosed in Japanese Patent Publication No. 07-146480 and No. 10-10518, in a method of forming the color filter, SiOx or SiNx is formed on a polymeric layer formed on the color filter layer with a DC sputtering, thereby improving adhesion of the transparent electrode layers. Japanese Patent Publication No. 2000-214318 has disclosed a method in which a low melting point glass is used. Also, Japanese Patent Publication No. 2000-223264 has disclosed a method in which a SiNx layer is formed with a CVD method to seal the organic EL luminous device from atmosphere.

In the color conversion type multicolor organic EL display, the inorganic film layer is required to have a permeability for the exciting light to efficiently transmit from the organic EL luminous device to the color conversion filter layers to reduce the power consumption and increase the lifetime.

In the color conversion type multicolor organic EL display, as shown in FIG. 2, an inorganic film layer, a polymeric film layer, and color conversion filter layers are disposed below transparent electrode layers. Light from an organic light-emitting layer passes through an interface between an organic layer and the transparent electrode layers, an interface between the transparent electrode layers and the inorganic film layer, and an interface between the inorganic film layer and the polymeric film layer, and reaches the color conversion filter layers. In general, light in the blue/green region of wavelength 450 to 500 nm is converted into blue, green and red light or the like. As the light from the organic light-emitting layer is reflected through interference at the above-mentioned interfaces in the device, an intensity of the transmitted light tends to fluctuate depending on a material and a thickness of each layer.

Consequently, to efficiently transmit the exciting light to the color conversion filter layers, it is necessary to provide an appropriate optical design for the inorganic film layer. The present invention has been accomplished in view of the problems described above, and it is an object of the present invention to provide a design for an inorganic film layer for efficiently transmitting the light from the organic EL luminous device, thereby obtaining a color conversion filter substrate and a multicolor organic EL display with stable light emission characteristics for a prolonged period of time.

Further objects and advantages of the invention will be apparent from the following description of the invention.

SUMMARY OF THE INVENTION

According to the first aspect of the present invention, a color conversion filter substrate comprises a transparent support substrate; a single type or a plurality of types of color conversion filter layers formed of a resin film containing a fluorescent colorant and formed on the support substrate in a desired pattern; a polymeric film layer formed of a transparent material for covering a surface of the support substrate on which the color conversion filter layers are formed and having a flat surface; a transparent inorganic film layer formed on the polymeric film layer; and a transparent electrode layer formed at an electrically independent region on the inorganic film layer. The inorganic film layer is formed of a single layer, and has a refractive index for light with a wavelength $\lambda$ in a range from 450 nm to 500 nm lower than that of the transparent electrode layer, and has a thickness d defined by nd=s$\lambda$/2, wherein n is the refractive index of the inorganic film layer for the light with a wavelength A$\lambda$, and s is a natural number.

According to the second aspect of the present invention, a color conversion filter substrate comprises a transparent support substrate; a single type or a plurality of types of color conversion filter layers formed of a resin film containing a fluorescent colorant and formed on the support substrate in a desired pattern; a polymeric film layer formed of a transparent material for covering a surface of the support substrate on which the color conversion filter layers are formed and having a flat surface; a transparent inorganic film layer formed on the polymeric film layer; and a transparent electrode layer formed at an electrically independent region on the inorganic film layer. The inorganic film layer is formed of at least double layers. One of the double layers adjacent to the transparent electrode has a refractive index for light with a wavelength A in a range from 450 nm to 500 nm lower than that of the transparent electrode layer. The inorganic film layer has (2p-1)th and (2p)th layers from the transparent electrode defined by $n_{2p-1}>n_{2p}$, $n_{2p-1}d_{2p-1}=s_{2p-1}\lambda/2$, and $n_{2p}d_{2p}=s_{2p}\lambda/4$, wherein p is a natural number, n is the refractive index of one layer in the inorganic film layer, d is the thickness of the one layer of the inorganic film layer, and s is a natural number.

According to the third aspect of the present invention, in the color conversion filter substrate according to the second aspect, the inorganic film layer is formed of layers having gradually decreasing refractive indexes for light with a wavelength $\lambda$ in a range from 450 nm to 500 nm from the transparent electrode layer toward the polymeric film layer.

According to the fourth aspect of the present invention, a color conversion filter substrate comprises a transparent support substrate; a single type or a plurality of types of color conversion filter layers formed of a resin film containing a fluorescent colorant and formed on the support substrate in a desired pattern; a polymeric film layer formed of a transparent material for covering a surface of the support substrate on which the color conversion filter layers are formed and having a flat surface; a transparent inorganic film layer formed on the polymeric film layer; and a transparent electrode layer formed at an electrically independent region on the inorganic film layer. The inorganic film layer is formed of at least double layers. One of the double layers adjacent to the transparent electrode has a refractive index for light with a wavelength λ in a range from 450 nm to 500 nm lower than that of the transparent electrode layer. The inorganic film layer has (2p-1)th and (2p)th layers from the transparent electrode defined by $n_{2p-1} < n_{2p}$, $n_{2p-1}d_{2p-1} = s_{2p-1} \lambda/4$, and $n_{2p}d_{2p} = s_{2p} \lambda/2$, wherein p is a natural number, n is the refractive index of one layer in the inorganic film layer, d is the thickness of the one layer in the inorganic film layer, and s is a natural number.

According to the fifth aspect of the present invention, a color conversion filter substrate comprises a transparent support substrate; a single type or a plurality of types of color conversion filter layers formed of a resin film containing a fluorescent colorant and formed on the support substrate in a desired pattern; a polymeric film layer formed of a transparent material for covering a surface of the support substrate on which the color conversion filter layers are formed and having a flat surface; a transparent inorganic film layer formed on the polymeric film layer; and a transparent electrode layer formed at an electrically independent region on the inorganic film layer. The inorganic film layer is formed of a single layer having gradually decreasing refractive indexes from the transparent electrode layer toward the polymeric film layer.

According to the sixth aspect of the invention, in the color conversion filter substrate according to the first to fifth aspects, the transparent electrode layer has a thickness d. Relative to a wavelength λ between 450 nm and 500 nm, the thickness d is defined by nd=sλ/2, wherein n is a refractive index of the transparent electrode layer for light with the wavelength λ, and s is a natural number.

According to the seventh aspect of the present invention, a color conversion type multicolor display includes a light-emitting layer containing a light-emitting-material and the second electrode layer formed in this order on the color conversion filter substrate according to any of the first to sixth aspect.

According to the eighth aspect of the present invention, a method of manufacturing a color conversion filter substrate comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; and forming a transparent electrode at an electrically independent region on the inorganic film layer. The inorganic film layer is formed of a single layer, and has a thickness d. Relative to a wavelength λ between 450 nm and 500 nm, the thickness d is defined by nd=sλ/2, wherein n is a refractive index of the inorganic film layer for light with the wavelength λ, and s is a natural number. The transparent electrode layer has a refractive index higher than that of the inorganic film layer.

According to the ninth aspect of the present invention, a method of manufacturing a color conversion filter substrate comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; and forming an transparent electrode at an electrically independent region on the inorganic film layer. The inorganic film layer is formed of at least double layers. One of the double layers adjacent to the transparent electrode has a refractive index for light with a wavelength λ in a range from 450 nm to 500 nm lower than that of the transparent electrode layer. The inorganic film layer has (2p-1)th and (2p)th layers from the transparent electrode defined by $n_{2p-1} > n_{2p}$, $n_{2p-1}d_{2p-1} = s_{2p-1} \lambda/2$, and $n_{2p}d_{2p} = s_{2p} \lambda/4$, wherein p is a natural number, n is the refractive index of one layer in the inorganic film layer, d is the thickness of the one layer of the inorganic film layer, and s is a natural number. The transparent electrode layer has a refractive index higher than that of the inorganic film layer.

According to the tenth aspect of the present invention, in the method of manufacturing the color conversion filter substrate according to the ninth aspect, the inorganic film layer has gradually decreasing refractive indexes for light with a wavelength λ in a range from 450 nm to 500 nm from the transparent electrode layer toward the polymeric film layer.

According to the eleventh aspect of the present invention, a method of manufacturing a color conversion filter substrate comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; and forming a transparent electrode at an electrically independent region on the inorganic film layer. The inorganic film layer is formed of at least double layers. One of the double layers adjacent to the transparent electrode has a refractive index for light with a wavelength λ in a range from 450 nm to 500 nm lower than that of the transparent electrode layer. The inorganic film layer has (2p-1)th and (2p)th layers from the transparent electrode defined by $n_{2p-1} < n_{2p}$, $n_{2p-1}d_{2p-1} = s_{2p-1} \lambda/4$, and $n_{2p}d_{2p} = s_{2p} \lambda/2$, wherein p is a natural number, n is the refractive index of one layer in the inorganic film layer, d is the thickness of the one layer of the inorganic film layer, and s is a natural number. The transparent electrode layer has a refractive index higher than that of the inorganic film layer.

According to the twelfth aspect of the present invention, a method of manufacturing a color conversion filter substrate comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; and forming a transparent electrode at an electrically independent region on the inorganic film layer. The inorganic film layer has a structure having continuously changed compositions. The transparent electrode layer has a refractive index higher than that of the inorganic film layer.

According to the thirteenth aspect of the present invention, a method of manufacturing a color conversion type multicolor display comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; forming a transparent electrode at an electrically independent region on the inorganic film layer; forming an organic light-emitting layer containing a light-emitting material on the transparent electrode layer; and forming the second electrode layer on the organic light-emitting layer. The inorganic film layer is formed of a single layer, and has a thickness d. Relative to a wavelength λ between 450 nm and 500 nm, the thickness d is defined by $nd = s\lambda/2$, wherein n is a refractive index of the inorganic film layer for light with the wavelength λ, and s is a natural number. The transparent electrode layer has a refractive index higher than that of the inorganic film layer.

According to the fourteenth aspect of the present invention, a method of manufacturing a color conversion type multicolor display comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; forming a transparent electrode at an electrically independent region on the inorganic film layer; forming an organic light-emitting layer containing a light-emitting material on the transparent electrode layer; and forming the second electrode layer on the organic light-emitting layer. The inorganic film layer is formed of at least double layers. One of the double layers adjacent to the transparent electrode has a refractive index for light with a wavelength A in a range from 450 nm to 500 nm lower than that of the transparent electrode layer. The inorganic film layer has (2p-1)th and (2p)th layers from the transparent electrode defined by $n_{2p-1} > n_{2p}$, $n_{2p-1} d_{2p-1} = s_{2p-1} \lambda/2$, and $n_{2p} d_{2p} = s_{2p} \lambda/4$, wherein p is a natural number, n is the refractive index of one layer of the inorganic film layer, d is the thickness of the one layer of the inorganic film layer, and s is a natural number. The transparent electrode layer has a refractive index higher than that of the inorganic film layer.

According to the fifteenth aspect of the present invention, in the method of manufacturing the color conversion type multicolor display according to the fourteenth aspect, the inorganic film layer gradually decreases refractive indexes for light with a wavelength λ in a range from 450 nm to 500 nm from the transparent electrode layer toward the polymeric film layer.

According to the sixteenth aspect of the present invention, a method of manufacturing a color conversion type multi-color display comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; forming a transparent electrode at an electrically independent region on the inorganic film layer; forming an organic light-emitting layer containing a light-emitting material on the transparent electrode layer; and forming the second electrode layer on the organic light-emitting layer. The inorganic film layer is formed of at least double layers. One of the double layers adjacent to the transparent electrode has a refractive index for light with a wavelength λ in a range from 450 nm to 500 nm lower than that of the transparent electrode layer. The inorganic film layer has (2p-1)th and (2p)th layers from the transparent electrode defined by $n_{2p-1} < n_{2p}$, $n_{2p-1} d_{2p-1} = s_{2p-1} \lambda/4$, and $n_{2p} d_{2p} = s_{2p} \lambda/2$, wherein p is a natural number, n is the refractive index of the one layer of the inorganic film layer, d is the thickness of the one layer of the inorganic film layer, and s is a natural number. The transparent electrode layer has a refractive index higher than that of the inorganic film layer.

According to the seventeenth aspect of the present invention, a method of manufacturing a color conversion type multicolor display comprises the steps of: preparing a transparent support substrate; forming a single type or a plurality of types of color conversion filter layers formed of a resin film containing a fluorescent colorant on the support substrate in a desired pattern; forming a polymeric film layer formed of a transparent material for covering a surface of the support substrate on which the color conversion filter layers are formed, and having a flat surface; forming a transparent inorganic film layer on the polymeric film layer; forming a transparent electrode at an electrically independent region on the inorganic film layer; forming an organic light-emitting layer containing a light-emitting material on the transparent electrode layer; and forming the second electrode layer on the organic light-emitting layer. The inorganic film layer has a structure having continuously changed compositions. The transparent electrode layer has a refractive index higher than that of the inorganic film layer.

DETAILED DESCRIPTION OF PREFERRED EMBODIMENTS

Figure 1:
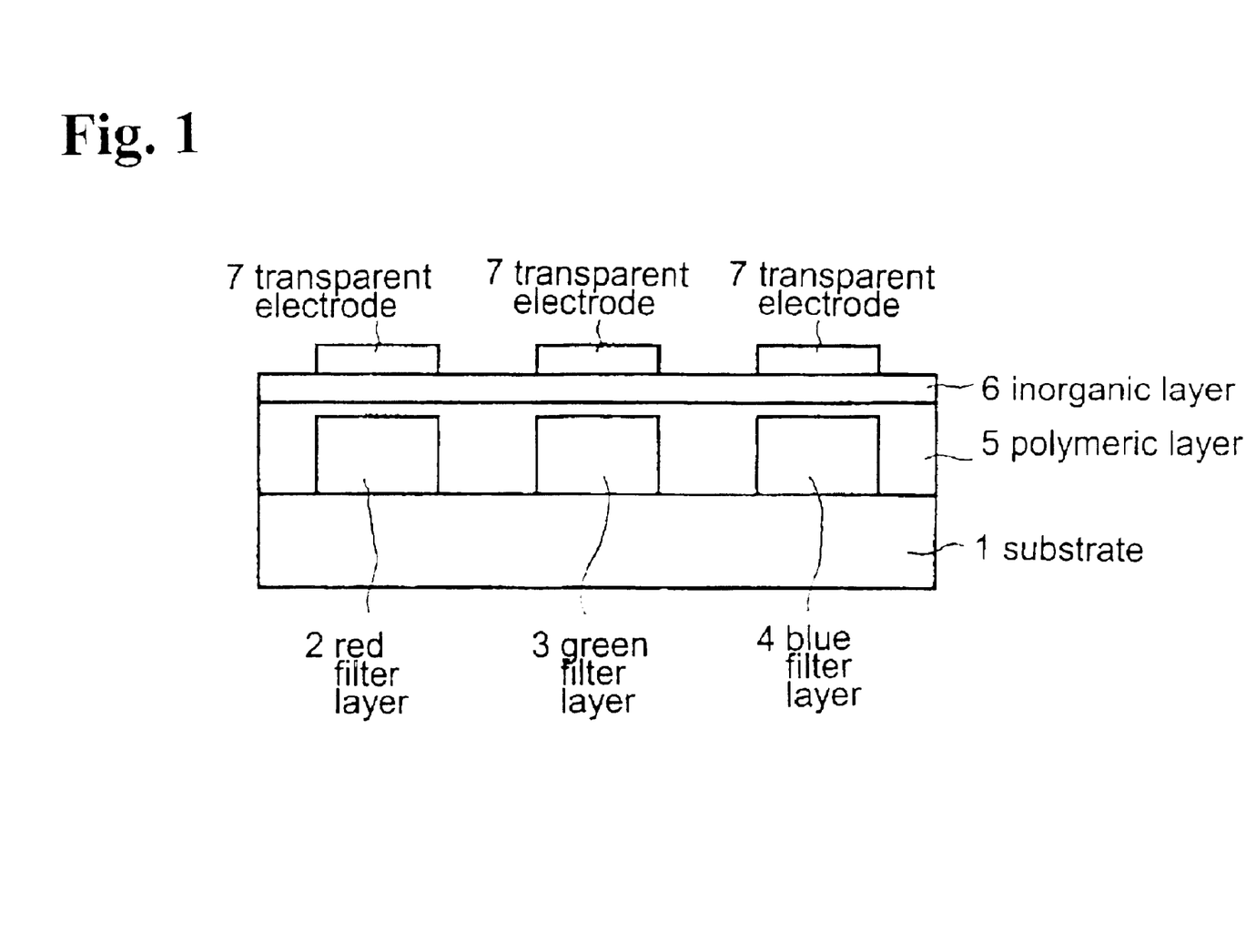
FIG. 1 is a schematic diagram showing a sectional view of a color conversion filter substrate.

An example of a color conversion filter substrate of the present invention is shown in FIG. 1. In FIG. 1, a red color conversion filter layer 2, a green color conversion filter layer 3 and a blue color conversion filter layer 4 are formed on a support substrate 1 in a specific pattern. As described later, the green color conversion filter layer 3 may be a green filter layer. Moreover, the blue color conversion filter layer 4 is preferably a blue filter layer. A polymeric layer 5 is covering the color conversion filter layers, and an inorganic layer 6 is formed thereon and has a flat upper surface. Transparent electrodes 7 are formed on the inorganic layer 6 at one or more electrically independent area. The following is a detailed description of each of the layers.

In the present invention, an organic fluorescence colorant constituting a color conversion filter layer absorbs light with a wavelength in a near-ultraviolet or visible region emitted by a luminous device, especially light with a wavelength in a blue or bluish green region, to emit another visible light. It is preferred that one or more types of fluorescence colorants emitting at least fluorescence with a wavelength in the red region are used, and may be combined with one or more types of fluorescence colorants emitting fluorescence with a wavelength in a green region.

In a case that an organic light emitting device that emits light with a wavelength in the blue or bluish-green region is used, when the light is converted to light with a wavelength in the red region through a simple red filter, an intensity of the light is greatly reduced due to a small amount of red light in the original light. It is possible to obtain high intensity light with a wavelength in the red region by using a fluorescence colorant to convert light from the organic light emitting device into light with a wavelength in the red region.

It is possible to obtain light with a wavelength in the green region by using another organic fluorescence colorant to convert light from the organic light emitting device into light with a wavelength in the green region. Alternatively, the light from the light emitting device may pass through a green filter to obtain green light when the light from the organic light emitting device contains a sufficient amount of light with a wavelength in the green region.

As for light with a wavelength in the blue region, an organic fluorescence colorant may be used to convert light from the organic light emitting device. It is preferred that the light from the organic light emitting device passes through a blue filter to obtain light with a wavelength in the blue region.

The fluorescence colorants that absorb light with a wavelength in the blue or bluish-green region emitted from the luminous device to emit fluorescence with a wavelength in the red region include, for example, rhodamine-based colorants such as rhodamine B, rhodamine 6G, rhodamine 3B, rhodamine 101, rhodamine 110, sulforhodamine, basic violet 11, and basic red 3, cyanine-based colorants, pyridine-based colorants such as 1-ethyl-2-(4-(p-dimethylaminophenyl)-13-butadienyl)-pyridium-perchlorate (pyridine 1), and oxazine-based colorants. Furthermore, various dyes (direct dyes, acid dyes, basic dyes, disperse dyes, etc.) can be used provided that they are fluorescent.

The fluorescence colorants that absorb light with a wavelength in the blue or bluish-green region emitted from the luminous device to emit fluorescence with a wavelength in the green region include, for example, coumarin-based colorants such as 3-(2'-benzothiazolyl)-7-diethylaminocoumarin (coumarin 6), 3-(2'-(benzimidazolyl)-7-N,N-diethylaminocoumarin (coumarin 7), 3-(2'-N-methylbenzimidazolyl)-7-N,N-diethylaminocoumarin (coumarin 30), and 2,3,5,6-1H,4H-tetrahydro-8-trifluoromethylquinolizino (9,9a, 1-gh) coumarin (coumarin 153), basic yellow 51 as a coumarin colorant-based dye, and naphthalimide-based colorants such as solvent yellow 11 and solvent yellow 116. Furthermore, various dyes (direct dyes, acid dyes, basic dyes, disperse dyes, etc.) can be used provided that they are fluorescent.

The organic fluorescence colorants may be formed in an organic fluorescent pigment by blending in advance into a resin such as polymethacrylate, polyvinyl chloride, vinyl chloride-vinyl acetate copolymer, alkyd resin, aromatic sulfonamide resin, urea resin, melamine resin, benzoguanamine resin, and a mixture of these resins. Further, these types of organic fluorescence colorants or organic fluorescent dyes (in the specification, these are collectively referred as organic fluorescence colorants) may be used solely, or two or more types of such colorants may be combined together in order to adjust hue of the fluorescence.

According to the present invention, the device contains 0.01 to 5 wt %, more preferably 0.1 to 2 wt %, of such an organic fluorescence colorant with reference to a weight of a fluorescence color conversion film. When the device contains less than 0.01 wt % of the organic fluorescence colorant, wavelength conversion will not be sufficient. When the device contains more than 5 wt % of the organic fluorescence colorant, the color-conversion efficiency may be decreased due to a concentration quenching effect or the like.

A matrix resin used for the fluorescence color conversion filter layers is a photo-setting or photo- and thermo-setting resin. The matrix resin is cured optically and/or thermally to generate radicals or ion seeds to polymerize and cross-link, thereby obtaining a material that is not soluble and does not melt. It is preferred that the photo-setting resin or photo- and thermo-setting resin is soluble in an organic solvent or an alkali solution before curing so that the fluorescence color conversion film is formed in a pattern.

The photo-setting resin or photo- and thermo-setting resin includes (1) a composition containing an acrylic multifunctional monomer/oligomer having acroyl groups or methacroyl groups and a photo- or thermo-polymerization initiator, wherein the composition is optically or thermally treated to generate optical or thermal radicals for polymerization, (2) a composition containing polyvinyl ester cinnamate and a sensitizer, wherein the composition is thermally treated to produce dimers for cross-linking, (3) a composition containing a linear or cyclic olefin and bisazido, wherein the composition is optically or thermally treated to generate nitrene to cross-link with the olefin, or (4) a composition containing monomers having an epoxy group and a photo oxidizer, wherein the composition is optically or thermally treated to generate acids (cations) for polymerization. In particular, the photo-setting resin or photo- and thermo-setting resin of (1) provides high resolution and easy pattern formation, as well as good solvent- and heat-resistance and the like. As described above, the photo-setting resin or photo- and thermo-setting resin is exposed to light, or is subjected under heat to form the matrix resin.

It is preferred that the photo-polymerization initiator used in the present invention initiates the polymerization by light with a wavelength that the fluorescence pigment contained in the initiator does not absorb. In the light conversion layer according to the present invention, when the photo-setting resin or photo- and thermo-setting resin itself can be polymerized by light or heat, the photo- or thermo-polymerization initiator may be omitted.

A solution or dispersion of the resin is applied to a support substrate to form a resin layer. Then, a desired portion of the photo-setting or photo- and thermo-setting resin is exposed for polymerization to form the matrix resin. After the desired portion of the photo-setting or photo- and thermo-setting resin is exposed to become insoluble, the resin is formed in a pattern. A patterning step includes a conventional method in which an unexposed portion of the resin is removed using an organic solvent or alkali solution that dissolves or disperses the resin.

A material for the polymeric layer 5 has high transparency in the visible region (permeability of 50% or greater at a wavelength of 400 nm to 700 nm), a Tg of 100° C. or higher, and a surface hardness of 2H or greater in terms of pencil hardness. The material is formed in a smooth coating film in the order of μm on the color conversion filter, and does not affect the functionality of the color conversion filter layers 2–4. Such a material includes a photo-setting resin and/or a thermo-setting resin such as an imide modified silicone resin (Japanese Patent Publications No. 05-134112, No. 07-218717, and No. 07-306311), an inorganic metal compound ($TiO$, $Al_2O_3$, $SiO_3$, or the like) dispersed in an acrylic, polyimide, silicone, or other resin (Japanese Patent Publications No. 05-119306 and No. 07-104114), an epoxy-modified acrylatol resin used as an ultraviolet curable resin (Japanese Patent Publication No. 07-48424), a resin having reactive vinyl groups of acrylate monomer/oligomer/polymer, or a resist resin (Japanese Patent Publications No. 06-300910, No. 07-128519, No. 08-279394, and No. 09-330793), or a fluorine-based resin (Japanese Patent Publications No. 05-36475 and No. 09-330793). The polymeric layer 5 may be formed of an inorganic compound formed by a sol-gel process (Monthly Display, Vol. 3, No. 7, 1997, Japanese Patent Publication No. 08-27394).

The polymeric layer 5 can be formed with various methods. For example, the layer may be formed with a conventional method such as a dry process (sputtering, vapor deposition, CVD, or the like) or a wet process (spin coating, roll coating, casting, or the like).

The inorganic layer 6 is preferably formed of a material that is electrically insulating, acts as a barrier against gases and organic solvents, has high transparency in the visible region (a transmittance of at least 50% in a range of 400 to 700 nm), and has a hardness sufficient to withstand during a forming process of the transparent electrode layer 7 onto the inorganic layer 6 (preferably a pencil hardness of at least 2H). For example, a material that contains silicon and at least one of oxygen and nitrogen, namely SiOx:H (i.e. silicon oxide which may contain hydrogen as an impurity), SiNx:H or SiOxNy:H, or a material comprising SiOx and a metal such as Al can be used as the inorganic layer.

The inorganic layer 6 may be a single layer, or a plurality of layers stacked on top of one another.

When applying the inorganic film layer 6 to the color conversion type multicolor organic EL display, several factors should be considered. That is, it is important to consider an effect of a refractive index and a thickness of the inorganic film layer on the display performance.

In general, in a case of a homogeneous material, a transmittance $t_n$ when light is incident perpendicular to a layer is defined by the following equation. In the equation, a target wavelength is $\lambda$, and a refractive index and a thickness of the (p)th layer are $n_p$ and $d_p$, and an amplitude reflectance and an energy reflectance between the (p-1)th layer and the (p)th layer are $\rho_{p,p-1}$ and $R_{p,p-1}$. Also, in the equation, $\gamma_p$ is a phase of the light passing through the (p)th layer, and $\gamma_{p,p-1}$ is a phase of the light passing through the (p)th layer considering the phase in the (p-1)th layer.

$$t_n = 1 - \frac{R_{p+1,p} + R_{p,0} + 2\rho_{p+1,p}\sqrt{R_{p,0}}\cos(\gamma_{p,0} + \gamma_p)}{1 + R_{p+1,p}R_{p,0} + 2\rho_{p+1,p}\sqrt{R_{p,0}}\cos(\gamma_{p,0} + \gamma_p)}$$

$$\gamma_p = 4\pi n_p d_p / \lambda$$

$$\tan\gamma_{p,0} = \frac{\sqrt{R_{p-1,0}}(1-\rho_{p,p-1}^2)\sin(\gamma_{p-1,0} + \gamma_{p-1})}{\rho_{p,p-1}(1 + R_{p-1,0}) + \sqrt{R_{p-1,0}}(1+\rho_{p,p-1}^2)\cos(\gamma_{p-1,0} + \gamma_{p-1})}$$

In a case that the inorganic film layer 6 is formed of a single layer, the inorganic film layer 6 has a refractive index for light with a wavelength $\lambda$ in a range from 450 nm to 500 nm lower than that of the transparent electrode layer 7. Also, the inorganic film layer 6 has a thickness d defined by $nd=s\lambda/2$, wherein n is the refractive index of the inorganic film layer for the light with a wavelength $\lambda$, and s is a natural number, thereby enhancing the transmittance of light of the target wavelength $\lambda$, and enlarging an interference peak half width. It is preferable that of the inorganic film layer 6 has the refractive index lower than that of the transparent electrode layers 7 but higher than that of the polymeric film layer 5.

In general, an ITO (indium-tin oxide) or $In_2O_3$—ZnO based material is used as a material of the transparent electrode layers 7. Theses materials have approximately 2.0 and 2.1 refractive indexes for the light with a wavelength 450 to 500 nm, respectively. It is preferable that the inorganic film layer 6 has an approximately 1.6 to 1.8 refractive index. A material such as SiOx, SiOxNy or AlxOy can be used to obtain such a refractive index.

Further, the inorganic film layer 6 may be formed of a laminate of at least two layers. In this case, a constituting layer adjacent to the transparent electrode layers 7 has a refractive index lower than that of the transparent electrode layers 7. Further, a layer of a material having a high refractive index and a layer of a material having a low refractive index may be laminated alternately. With this configuration, it is possible to enhance the transmittance to light with a specified wavelength, and enlarge the interference peak half width.

In case of a laminate of at least two layers, it is possible that an odd number layer from the transparent electrode layer 7 is formed of a material having a high refractive index, and an even number layer material from the transparent electrode layer 7 is formed of a material having a low refractive index. Alternatively, it is possible that an odd number layer from the transparent electrode layer 7 is formed of a material having a low refractive index, and an even number layer material from the transparent electrode layer 7 is formed of a material having a high refractive index. In either case, relative to the light with a wavelength $\lambda$ in a range of 450 to 500 nm that is emitted from the organic EL luminous device, it is preferable that a layer having a high refractive index has a thickness n defined by $nd=s\lambda/2$ (n: refractive index, d: thickness, s: natural number), and a layer having a low refractive index has a thickness n defined by $nd=s\lambda/4$ (n: refractive index, d: thickness, s: natural number).

For example, in a case that the inorganic film layer 6 is formed of two layers using two materials, it is possible to use SiOx and SiNx, or DLC and AlxOy, or the like. Moreover, in a case that the inorganic film layer 6 is formed of three layers using three materials, it is possible to use SiOx, SiOxNy, and SiNx, or the like. In particular, it is preferred that the inorganic film layer 6 is formed of layers having refractive indexes gradually decreasing from the transparent electrode layer 7 toward the polymeric film layer 5.

When the inorganic film layer 6 is formed of layers having refractive indexes gradually decreasing from the transparent electrode layer 7 toward the polymeric film layer 5, it is possible to increase a transmittance of light with a specified wavelength and enlarge an interference peak half width. For example, by decreasing x (the N-to-Si ratio) in SiNx, the refractive index of the inorganic film layer 6 can be decreased continuously, thereby obtaining the above effect.

It is necessary that a material of the transparent electrode layers 7 efficiently transmits the exciting light emitted by the organic EL luminous device (i.e. light in the near ultraviolet to visible region, preferably blue to blue/green light). An ITO (indium-tin oxide) or $In_2O_3$—ZnO based material can be used as mentioned earlier. Relative to the light with a wavelength in a range of 450 to 500 nm emitted by the organic EL luminous device, it is preferred that the transparent electrode layer has a thickness d defined by $nd=s\lambda/2$, wherein n is the refractive index of the inorganic film layer for the light with a wavelength $\lambda$, and s is a natural number.

With the inorganic film layer 6 and the transparent electrode layers 7 having a thickness as defined above, it is possible that the inorganic film layer 6 and the transparent electrode layers 7 in the present invention efficiently transmit the exciting light emitted by the organic EL luminous device.

Note that a shape of the transparent electrode layers 7 depends on a design of the organic EL luminous device formed thereon, and hence will be described later in a section on the organic EL luminous device.

In the color conversion filter according to the present invention, the support substrate 1 is required to be transparent with respect to light converted by the color conversion layers 2 to 4. Further, the support substrate 1 is required to withstand conditions (solvent, temperature, and the like) in the process of forming the color conversion layers 2 to 4 and the polymeric layer 5, and moreover, the support substrate 1 is preferably dimensionally stable.

A preferable material for the support substrate 1 includes such a resin as polyethyleneterephthalate and polymethylmethacrylate. A fusion glass is particularly preferable.

According to the present invention, one or more types of color conversion films are formed on the support substrate 1 in a desired pattern to form the color conversion filter. A composition containing the fluorescence pigment and resist is applied on the support substrate 1, and is exposed to the light through a mask of the desired pattern to form the pattern. The color conversion layers have a thickness more than 5 $\mu$m, preferably 8 to 15 $\mu$m.

In producing the color display, three types of color conversion films for red, green, and blue are preferably formed. In a case that a luminous device emitting blue or bluish-green light is used, it is possible to form red and green color conversion films and a blue filter layer.

A pattern of the color conversion filter layers and the filter layer depends on an application. A set of rectangular or circular areas for red, green, and blue may be produced over an entire support substrate. Alternatively, a set of adjacent and parallel stripes (with a specific width and a length equal to that of the support substrate 1) for red, green, and blue may be produced over the entire support substrate. A color conversion film of a particular color may be formed in a larger area (the number of areas, or a total area) than that of color conversion films of the other colors.

According to the present invention, the color conversion color display includes the color conversion filter substrate and the organic EL luminous device provided on the inorganic film layer 6 of the filter substrate. The organic EL luminous device emits light with a wavelength in the near-ultraviolet or visible region, preferably light with a wavelength in the blue or bluish-green region. The light is ejected on the fluorescence color conversion filter. The light is then output from the fluorescence color conversion filter layer as visible light with a different wavelength.

The organic EL luminous device is structured so as to sandwich an organic luminous layer between the transparent electrode 7 and the second electrode. As needed, a hole-injection layer, a hole-transport layer and/or an electron-injection layer are interposed between the luminous layers.

The luminous device is composed of layers specified below;
(1) Positive electrode/organic light-emitting layer/negative electrode,
(2) Positive electrode/hole-injection layer/organic light-emitting layer/negative electrode,
(3) Positive electrode/organic light-emitting layer/electron-injection layer/negative electrode,
(4) Positive electrode/hole-injection layer/organic light-emitting layer/electron-injection layer/negative electrode,
(5) Positive electrode/hole-injection layer/hole-transporting layer/organic light-emitting layer/electron-injection layer/negative electrode.

In the layer configurations described above, it is preferred that at least one of the positive and negative electrodes is the transparent electrode 7. In the present invention, the positive electrode is desirably the transparent electrode 7.

FIG. 2 shows an example of the multicolor organic EL display of the present invention. In FIG. 2, a part that corresponds to one pixel of an organic EL luminous device having a plurality of pixels for use as a color conversion type multicolor or full-color display is shown. A hole injection layer 8, a hole transport layer 9, an organic light-emitting layer 10, an electron injection layer 11, and cathodes (second electrode layers) 12 are formed in this order at the positions corresponding to the color conversion filter layers 2, 3 and 4, on the transparent electrode layers 7 of the color conversion filter substrate shown in FIG. 1.

A material for each of the layers is well known. For example, in a case that the organic light-emitting layer 10 emits light with a wavelength in the blue or bluish-green region, a material includes benzothiazole-, benzimidazole-, benzoxazole-based fluorescent whitening agent, a metal chelated oxonium compound, a styrylbenzene-based compound, and an aromatic dimethylidine compound.

The negative electrode 12 is formed of a metal electrode. The positive and negative electrodes 7 and 12 may be formed in a parallel stripe pattern, or a cross pattern that the positive electrode 7 crosses the negative electrode 12. In a case of the cross pattern, the organic light emitting device of the present invention can be driven in matrix. That is, when a voltage is applied to a particular stripe of the positive electrodes 7 and a particular stripe of the negative electrodes 12, light is emitted from the point at which these stripes intersect. Accordingly, light can be emitted from a pixel of the organic light emitting device in which a particular fluorescence color conversion film and/or filter layer is located, when a voltage is applied to selected stripes of the positive and negative electrodes 7 and 12.

Alternatively, the positive electrode 7 may be formed in a uniform plane without a stripe pattern, and the negative electrode 12 may be formed in a pattern corresponding to the pixels. In such a case, switching elements corresponding to the respective pixels may be provided for active matrix driving.

In the examples shown below, a scanning electron microscope (SEM) was used to determine a thickness of the inorganic film layer with correction using a standard sample. A measurement error in this case was ±10 nm. A refractive index of the inorganic film layer was calculated from spectroscopic ellipsometer measurements. A plurality of samples having different thicknesses was measured to improve an accuracy of the refractive index measurement. A measurement error in this case was ±0.05.

EXAMPLE 1

A UV curing type resin (epoxy-modified acrylate) was applied to a glass substrate with a spin coating method. A high-pressure mercury lamp irradiated light to form a polymeric film layer of thickness 8 $\mu$m. A SiOx film with a thickness approximately 300 nm was formed on the polymeric film layer with an RF sputtering method without heating the substrate using boron-doped Si as a target in an atmosphere of Ar containing 20% of $O_2$. A refractive index of the SiOx film was measured to be approximately 1.6 relative to light with a wavelength 475 nm using an ellipsometer. The SiOx film satisfied the previously mentioned relationship nd=s$\lambda$/2 (s=2).

A transparent electrode layer formed of an $In_2O_3$—ZnO based material with a thickness of 220 nm was formed on the SiOx film with a DC sputtering method using IDIXO (made by Idemitsu Kosan Co., Ltd.) as a target in an atmosphere of Ar containing 20% of $O_2$. A refractive index of the transparent electrode layer relative to light with a wavelength of 475 nm was found to be approximately 2.1. The transparent electrode layer satisfied the previously mentioned relationship nd=s$\lambda$/2 (s=2).

EXAMPLE 2

Similar to Example 1, a polymeric film layer was formed on a glass substrate. A SiNx film with a thickness approximately 120 nm was formed on the polymeric film layer with the RF sputtering method without heating the substrate using boron-doped Si as a target in an atmosphere of Ar containing 30% of $N_2$. A refractive index of the SiNx film was measured to be approximately 2.0 relative to light with a wavelength 475 nm using an ellipsometer. The SiNx film satisfied the previously mentioned relationship nd=s$\lambda$/4 (s=1).

A SiOx film with a thickness of 75 nm was formed on the SiNx film with the RF sputtering method without heating by using boron-doped Si as a target in an atmosphere of Ar containing 20% of $O_2$. A refractive index of the SiOx film relative to light with a wavelength of 475 nm was found to be approximately 1.6. The transparent electrode layer satisfied the previously mentioned relationship nd=s$\lambda$/4 (s=1).

Finally, a transparent electrode layer formed of an $In_2O_3$—ZnO based material with a thickness of 220 nm was formed on the SiOx film with the DC sputtering method using IDIXO (made by Idemitsu Kosan Co., Ltd.) as a target in an atmosphere of Ar containing 20% of $O_2$. A refractive index of the transparent electrode layer relative to light with a wavelength of 475 nm was determined to be approximately 2.1. The transparent electrode layer satisfied the previously mentioned relationship nd=s$\lambda$/2 (s=2).

EXAMPLE 3

Similar to Example 1, a polymeric film layer was formed on a glass substrate. A SiOx film with a thickness approximately 75 nm was formed on the polymeric film layer with the RF sputtering method without heating the substrate using boron-doped Si as a target in an atmosphere of Ar containing 20% of $O_2$. A refractive index of the SiOx film was measured to be approximately 1.6 relative to light with a wavelength 475 nm using an ellipsometer. The SiOx film satisfied the previously mentioned relationship nd=s$\lambda$/4 (s=1).

A SiNx film with a thickness of 120 nm was formed on the SiOx film with the RF sputtering method without heating by using boron-doped Si as a target in an atmosphere of Ar containing 30% of $N_2$. A refractive index of the SiNx film relative to light with a wavelength of 475 nm was found to be approximately 2.0. The transparent electrode layer satisfied the previously mentioned relationship nd=s$\lambda$/2 (s=1).

Then, a SiOx film with a thickness of 75 nm was formed on the SiNx film with the RF sputtering method without heating by using boron-doped Si as a target in an atmosphere of Ar containing 20% of $O_2$. A refractive index of the SiOx film relative to light with a wavelength of 475 nm was found to be approximately 1.6. The transparent electrode layer satisfied the previously mentioned relationship nd=s$\lambda$/4 (s=1).

Finally, a transparent electrode layer formed of an $In_2O_3$—ZnO based material with a thickness 220 nm was formed on the SiOx film with the DC sputtering method using IDIXO (made by Idemitsu Kosan Co., Ltd.) as a target in an atmosphere of Ar containing 20% of $O_2$. A refractive index of the transparent electrode layer relative to light with a wavelength of 475 nm was determined to be approximately 2.1. The transparent electrode layer satisfied the previously mentioned relationship nd=s$\lambda$/2 (s=2).

EXAMPLE 4

Similar to Example 1, a polymeric film layer was formed on a glass substrate. A SiNx film was formed on the polymeric film layer with the plasma CVD method using $SiH_4$ and $NH_3$ gases at a substrate temperature of 180° C. During an initial period of the film deposition, the raw material gases were introduced with an $SiH_4$:$NH_3$ flow ratio of 15.0, and an SiNx film with a thickness approximately 60 nm was formed. Then, the film deposition was continued while gradually increasing the $SiH_4$:$NH_3$ flow ratio, thus forming an SiNx film with a thickness of 180 nm (total thickness was 240 nm). The final $SiH_4$:$NH_3$ flow ratio was 20.0.

A transparent electrode layer formed of an $In_2O_3$—ZnO based material with a thickness 220 nm was formed on the SiNx film with the DC sputtering method using IDIXO (made by Idemitsu Kosan Co., Ltd.) as a target in an atmosphere of Ar containing 20% of $O_2$. A refractive index of the transparent electrode layer relative to light with a wavelength of 475 nm was found to be approximately 2.1. The transparent electrode layer satisfied the previously mentioned relationship nd=s$\lambda$/2 (s=2).

COMPARATIVE EXAMPLE 1

A polymeric film layer was formed on a glass substrate as in Example 1. A SiOx film with a thickness of approximately 75 nm was formed on the polymeric film layer with the RF sputtering method without heating the substrate using boron-doped Si as a target in an atmosphere of Ar containing 20% of $O_2$. A refractive index of the SiOx film relative to light with a wavelength of 475 nm using an ellipsometer was determined to be approximately 1.6. The SiOx film did not satisfy the previously mentioned relationship nd=s$\lambda$/2 (s: natural number), but rather satisfied the previously mentioned relationship nd=s$\lambda$/4 (s=1).

A transparent electrode layer formed of an $In_2O_3$—ZnO based material with a thickness 220 nm was formed on the SiNx film with the DC sputtering method using IDIXO (made by Idemitsu Kosan Co., Ltd.) as a target in an atmosphere of Ar containing 20% of $O_2$. A refractive index of the transparent electrode layer relative to light with a wavelength of 475 nm was found to be approximately 2.1. The transparent electrode layer satisfied the previously mentioned relationship nd=s$\lambda$/2 (s=2).

Evaluation of the Inorganic Film Layers

Figure 3:
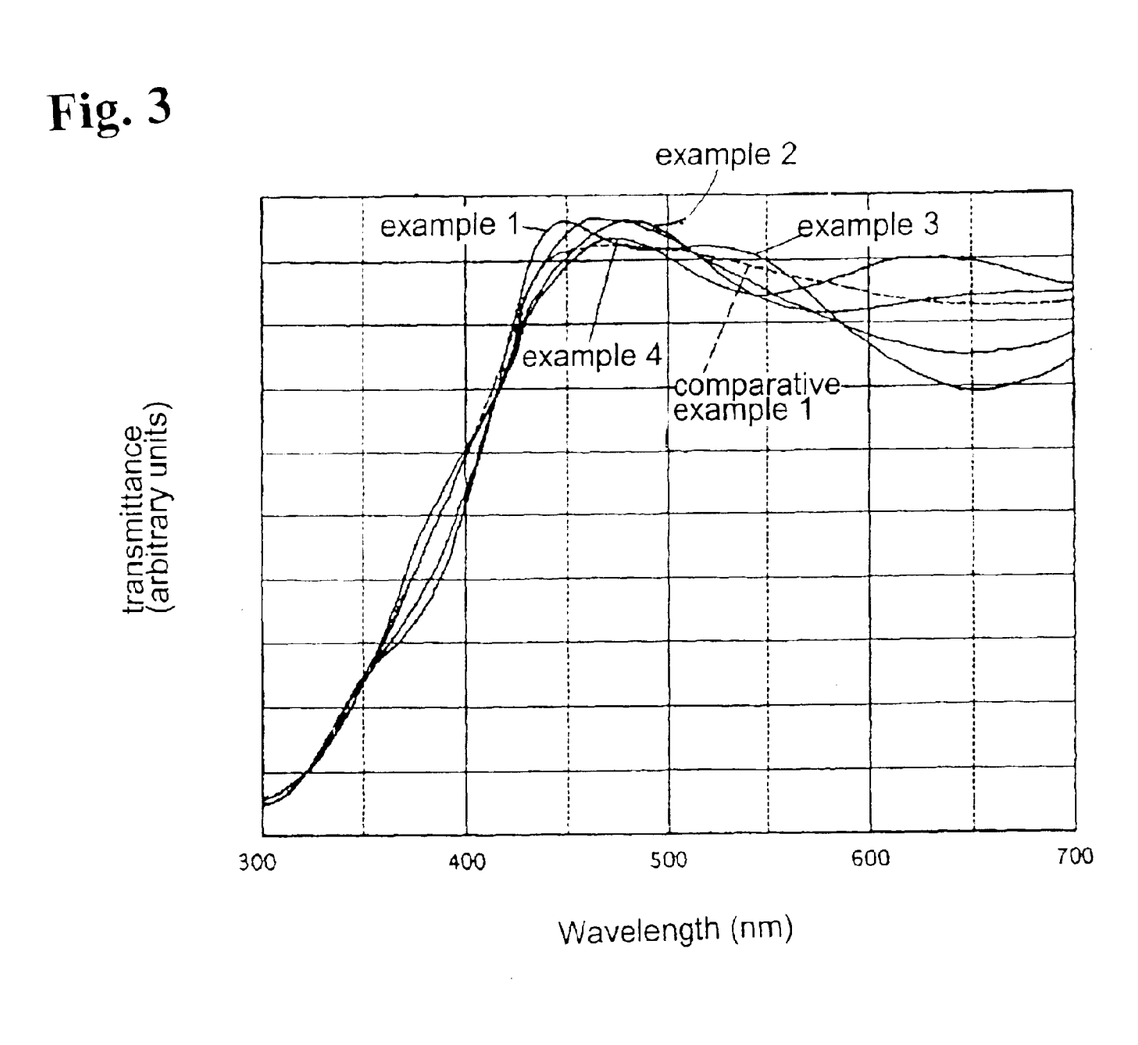
FIG. 3 is a graph showing light transmittance for Examples 1 to 4 and Comparative Example 1.

For Examples 1 to 4 and Comparative Example 1, the transmittance of light in a wavelength range of 300 to 700 nm was measured using a UV-PC2100 ultraviolet-visible transmittance measuring apparatus (made by Shimadzu Corporation). The results are shown in FIG. 3.

It was found that Examples 1 to 4 of the present invention have higher transmittance at a wavelength of 475 nm and broader width of the transmission curve peak as compared with Comparative Example 1. The transmittance for each Example at wavelengths of 450 nm and 500 nm are lower than the maximum transmittance by less than 3%. From the above results, it was shown that the inorganic film layers of the present invention are useful for manufacturing multicolor organic EL displays.

In Example 1, the refractive index of the inorganic film layer is lower than that of the transparent electrode layer, and the relationship nd=s$\lambda$/2 (s=2) is satisfied. In Examples 2 and 3, the inorganic film layer is formed of the laminated materials having a high refractive index and a low refractive index, and nd=s$\lambda$/2 (s: natural number) is satisfied for the material having a high refractive index, and nd=s$\lambda$/2 (s: natural number) is satisfied for the material having a low refractive index. In Example 4, the inorganic film layer has a composition such that the refractive index of the inorganic film layer gradually decreases from the transparent electrode layer toward the polymeric film layer.

EXAMPLE 5

Hereunder, an example to which a laminate type inorganic film layer of the present invention is applied will be explained with reference to the drawings.

FIG. 1 is a sectional view of an example of the color conversion filter substrate. The red color conversion filter layer 2, green color conversion filter layer 3 and blue color conversion filter layer 4 are formed on the transparent support substrate 1 in a specific pattern. Note that the blue color conversion filter layer 4 in the present Example is a simple non-fluorescent blue filter. The polymeric film layer 5 and the inorganic film layer 6 are formed on the color conversion filter layers, and the transparent electrode layers 7 are provided thereon.

FIG. 2 is a sectional view of an example of a color conversion type multicolor organic EL display, which comprises the above-mentioned color conversion filter substrate, and specific layers including an organic EL light-emitting layer are formed thereon.

Production of Blue Filter Layer 4

A blue filter material (manufactured by Fuji Hunt Electronics Technology Co., Ltd.; Color Mosaic CB-7001) was coated on a non-alkaline glass (Corning 1737 glass 50×50× 1.1 mm) as the transparent substrate 1 with the spin-coating process. The film was then patterned with the photolithography to obtain a pattern of the blue filter layer 4 having a line width of 0.1 mm, a pitch (cycle) of 0.33 mm, and a film thickness of 6 $\mu$m.

Production of Green Conversion Filter Layer 3

Coumarin 6 (0.7 parts by weight) as the fluorescent colorant was dissolved into 120 parts by weight of propylene glycol monomethyl ethel acetate (PGMEA) as a solvent. Then, 100 parts by weight of the photo-polymerizing resin "V259PA/P5" (trade name; manufactured by Nippon Steel Chemical Co., Ltd.) was added and dissolved in the mixture to obtain a coating liquid.

The coating liquid was applied to the transparent substrate 1 with the spin-coating process. The resulting film was then patterned with the photolithography to obtain a pattern of the green conversion layer 3 having a line width of 0.1 mm, a pitch (cycle) of 0.33 mm, and a film thickness of 10 $\mu$m.

Production of Red Conversion Filter Layer 2

Coumarin 6 (0.6 parts by weight), rhodamine 6G (0.3 parts by weight), and basic violet 11 (0.3 parts by weight) as the fluorescent colorants were dissolved in 120 parts by weight of PGMEA as a solvent. Then, 100 parts by weight of the photo-polymerizing resin "V259PA/P5" (trade name; manufactured by Nippon Steel Chemical Co., Ltd.) was added and dissolved in the mixture to obtain a coating liquid.

The coating liquid was applied to the transparent substrate 1 with the spin-coating process. The substrate was then patterned with the photolithography to obtain a line pattern of the red conversion layer 2 having a line width of 0.1 mm, a pitch of 0.33 mm, and a film thickness of 10 $\mu$m.

The red conversion filter layer 2, green color conversion filter layer 3 and blue filter layers 4 formed as described above were arranged in a pattern of parallel lines with 0.01 mm of gaps therebetween.

Production of Polymeric Layer 5

A UV cure resin (epoxy modified acrylate) was applied to the color conversion layers 2–4 and the color conversion layers with the spin-coating process, and the polymeric layer 5 was formed with the high-power mercury lamp. The polymeric layer 5 has a thickness of 8 $\mu$m on each of the color conversion filter layers. At this time, the patterns of the color conversion filter layers were not deformed, and a top surface of the protective layer 5 remained flat.

Manufacture of Inorganic Film Layer 6

A SiNx film with a thickness of 120 nm was formed on the polymeric film layer 5 with the reactive RF sputtering method using boron-doped Si as a target in an atmosphere of Ar containing 20% of $N_2$, a film deposition pressure of 0.45 Pa, and a film deposition electrical power of 1.5 W. A refractive index of the SiNx film relative to light with a wavelength of 475 nm using an ellipsometer was found to be approximately 2.1. The film satisfied the previously mentioned relationship nd=s$\lambda$/2 (s=1).

Then, a SiOx film with a thickness of 75 nm was formed on the SiNx film with the reactive RF sputtering method using boron-doped Si as a target in an atmosphere of Ar containing 20% of $O_2$, a film deposition pressure of 0.45 Pa, and a film deposition electrical power of 1.5 W. A refractive index of the SiOx film relative to light with a wavelength of 475 nm using an ellipsometer was determined to be approximately 1.6. The film satisfied the previously mentioned relationship nd=s$\lambda$/4 (s=1).

Manufacture of Transparent Electrode Layers 7

The transparent electrode (IDIXO) was formed on an entire surface of the inorganic film layer with the sputtering process. After the resist agent "OFRP-800" (trade name; manufactured by Tokyo Ohka Kogyo Co. Ltd.) was applied to the IDIXO, the resulting layer was patterned with the photolithography, thereby obtaining the transparent electrodes 7 in a stripe pattern with a width of 0.094 mm, a gap of 0.016 mm, and a thickness of 100 nm located at the respective color conversion layers 2 to 4. A refractive index of the transparent electrode layers relative to light with a wavelength of 475 nm was approximately 2.1. The transparent electrode layers satisfied the previously mentioned relationship $nd=s\lambda/2$ (s=1). The transparent electrode layers 7 were used as the positive electrode.

Manufacture of organic EL luminous device As shown in FIG. 2, six layers were sequentially stacked on the color conversion filter produced as described above. The six layers included the transparent electrode 7, hole-injection layer 8, hole-transporting layer 9, organic light-emitting layer 10, electron-injection layer 11, and negative electrode 12.

The color conversion filter substrate with the transparent electrodes 7 formed thereon was placed in a resistance-heating vapor-deposition apparatus. Then, the hole-injection layer 8, the hole-transporting layer 9, the organic light-emitting layer 10, and the electron-injection layer 11 were sequentially formed on the substrate in a vacuum. During the forming step of the films, an internal pressure of a vacuum chamber was reduced to $1\times10^4$ Pa. As the hole-injection layer 8, copper phthalocyanine (CuPc) was stacked in a thickness of 100 nm. As the hole-transporting layer 9, 4,4'-bis(N-(1-naphthyl)-N-phenylamino) biphenyl (α-NPD) was stacked in a thickness of 20 nm. As the light-emitting layer 10, 4,4'-bis(2,2-diphenylvinyl) biphenyl (DPVBi) was stacked in a thickness of 30 nm. Furthermore, as the electron-injection layer 11, aluminum chelate (Alq) was stacked in a thickness of 20 nm. Chemical structures of the materials used for these layers are shown in Table 1 below.

TABLE 1

| Layer configuration | Material | Chemical Structure |
|---|---|---|
| Hole-injection layer | Copper phthalocyanine |  |
| Hole-transporting layer | 4,4'-bis(N-(1-naphthyl)-N-phenylamino) biphenyl |  |
| Light-emitting layer | 4,4'-bis(2,2-diphenylvinyl) biphenyl |  |

TABLE 1-continued

| Layer configuration | Material | Chemical Structure |
|---|---|---|
| Electron-transporting layer | Tris(8-hydroxyquinoline) aluminum complex | |

Then, the negative electrode 12 consisting of an Mg/Ag (weight ratio: 10 to 1) layer with 200 nm of a thickness was formed using a mask of a stripe pattern with a width of 0.30 mm and a gap of 0.03 mm perpendicular to the stripes of the positive (transparent) electrodes 7 in the vacuum.

The organic multicolor light emitting device thus obtained was sealed in a glove box under a dry-nitrogen atmosphere (oxygen and moisture, both with a concentration of 10 ppm or less) using a sealing glass (not shown) and a UV cure adhesive.

EXAMPLE 6

A multicolor organic EL display was manufactured using the same method as in Example 5, except that the inorganic film layer 6 was manufactured using the method described below.

As the inorganic film layer 6, a SiNx film was formed with the plasma CVD method using $SiH_4$ and $NH_3$ gases at a substrate temperature of 180° C. During the initial period of the film deposition, the raw material gases were introduced with a $SiH_4$:$NH_3$ flow ratio of 15.0, and an SiNx film with a thickness of approximately 60 nm was formed. After that, the film deposition was continued while gradually increasing the $SiH_4$:$NH_3$ flow ratio, thus the SiNx film with a total thickness of 240 nm was formed. The final $SiH_4$:$NH_3$ flow rate ratio was 20.0.

COMPARATIVE EXAMPLE 2

A multicolor organic EL display was manufactured using the same method as in Example 5, except that the inorganic film layer 6 was manufactured using the method described below.

As the inorganic film layer 6, a SiOx film with a thickness of approximately 60 nm was formed with the RF sputtering method without heating the substrate using boron-doped Si as a target in an atmosphere of Ar containing 20% of $O_2$. A refractive index of the SiOx film relative to light with a wavelength of 475 nm using an ellipsometer was approximately 1.6. This SiOx film did not satisfy the previously mentioned relationship $nd=s\lambda/2$ (s: natural number).

Evaluation of Multicolor Organic EL Displays

Driving tests were carried out on the displays manufactured according to Examples 5 and 6 and Comparative Example 2. The driving was carried out through line-sequential scanning with a driving frequency of 60 Hz, a duty ratio of 1/60, and a current per pixel of 2 mA. Area brightness was compared with a case that only the green pixels were lit. The results are shown below in Table 2.

TABLE 2

| Sample | Area brightness (cd/m2) | Brightness ratio (relative Comparative Example 2) |
|---|---|---|
| Example 5 | 112 | 118 |
| Example 6 | 106 | 112 |
| Comparative Example 2 | 95 | 100 |

It is apparent that the multicolor organic EL display using the inorganic film layer according to the present invention has the brightness higher than the comparative example by at least 10%.

According to the present invention, the inorganic film layer that satisfies the refractive index and thickness conditions is used. As a result, the light from the organic EL luminous device is transmitted efficiently. Further, the moisture, which causes deterioration of the characteristics of the organic EL luminous device, can be prevented from entering the device. Therefore, it is possible to provide the multicolor organic EL display with the stable light emission characteristics for a prolonged period of time. According to the present invention, the color conversion type organic EL display has excellent reliability.

While the invention has been explained with reference to the specific embodiments of the invention, the explanation is illustrative and the invention is limited only by the appended claims.

What is claimed is:

1. A color-converting filter substrate, comprising:

a transparent supporting substrate;

at least one color-converting filter layer formed of a resin film containing fluorescent colorant, said filter layer being formed in a desired pattern on the supporting substrate;

a transparent polymeric film layer for covering the color-converting filter layer to form a flat surface;

a single transparent inorganic film layer formed on the polymeric film layer; and a transparent electrode layer formed in at least one electrically independent region on the inorganic film layer;

wherein for a wavelength λ in a range from 450 nm to 500 nm inclusive, a refractive index of the inorganic film layer is lower than a refractive index of the transparent electrode layer, and a thickness d of the inorganic film layer satisfies a relationship $$nd=s\lambda/2,$$

wherein n is a refractive index of the inorganic film layer to light of the wavelength λ, and s is a natural number.

2. A color-converting filter substrate, comprising:
a transparent supporting substrate;
at least one color-converting filter layer formed of a resin film containing fluorescent colorant and formed in a desired pattern on the supporting substrate;
a transparent polymeric film layer for covering the color-converting filter layer to form a flat surface;
at least two transparent inorganic film layers formed on the polymeric film layer; and
a transparent electrode layer formed in at least one electrically independent region on the inorganic film layer;
wherein for a wavelength λ in a range from 450 nm to 500 nm inclusive, a refractive index of one of the inorganic film layers adjacent to the transparent electrode layer is lower than that of the transparent electrode layer, and refractive indices and thicknesses of $(2p-1)^{th}$ and $2p^{th}$ inorganic film layers, which are counted from the transparent electrode layer starting from the $(2p-1)^{th}$ layer, wherein p is a natural number, satisfy the relationships $$n_{2p-1}>n_{2p},$$
$$n_{2-1}d_{2p-1}=s_{2p-1}\lambda/2, \text{ and}$$
$$n_{2p}d_{2p}=s_{2p}\lambda/4,$$

wherein n is a refractive index of one inorganic film layer, d is a thickness of the one inorganic film layer, and s is a natural number.

3. A color-converting filter substrate according to claim 2, wherein for the wavelength λ in the range from 450 nm to 500 nm inclusive, the refractive indexes of the inorganic film layers gradually become lower from the transparent electrode layer toward the polymeric film layer.

4. A color-converting filter substrate, comprising:
a transparent supporting substrate;
at least one color-converting filter layer formed of a resin film containing fluorescent colorant and formed in a desired pattern on the supporting substrate;
a transparent polymeric film layer for covering the color-converting filter layer to form a flat surface;
a transparent inorganic film layer formed of a laminate of at least two inorganic film layers deposited on the polymeric film layer; and
a transparent electrode layer formed in at least one electrically independent region on the inorganic film layer;
wherein for a wavelength λ in a range from 450 nm to 500 nm inclusive, a refractive index of one of the inorganic film layers adjacent to the transparent electrode layer is lower than a refractive index of the transparent electrode layer, and refractive indices and thicknesses of $(2p-1)^{th}$ and $2p^{th}$ inorganic film layers, which are counted from the transparent electrode layer starting from the $(2p-1)^{th}$ layer, wherein p is a natural number, satisfy relationships $$n_{2p-1}>n_{2p},$$
$$n_{2p-1}d_{2p-1}=s_{2p-1}\lambda/4, \text{ and}$$
$$n_{2p}d_{2p}=s_2\lambda/2,$$

wherein n is a refractive index of one inorganic film layer, d is a thickness of the inorganic film layer, and s is a natural number.

5. A color-converting filter substrate, comprising:
a transparent supporting substrate;
at least one color-converting filter layer formed of a resin film containing fluorescent colorant and formed in a desired pattern on the supporting substrate;
a transparent polymeric film layer for covering the color-converting filter layers to form a flat surface;
a single transparent inorganic film layer formed on the polymeric film layer; and
a transparent electrode layer formed in at least one electrically independent regions on the inorganic film layer;
wherein said inorganic film layer includes a composition such that a refractive index of the inorganic film layer decreases continuously from the transparent electrode layer toward the polymeric film layer.

6. A color-converting filter substrate according to claim 1, wherein for the wavelength λ in the range from 450 nm to 500 nm inclusive, a thickness t of the transparent electrode layer satisfies a relationship $$nd=t\lambda/2,$$

wherein m is the refractive index of the transparent electrode layer to light of wavelength λ, and t is a natural number.

7. A color conversion multi-color display, comprising the color-converting filter substrate according to claim 1, a light-emitting layer containing at least a light-emitting material above the color-converting filter substrate, and a second electrode layer above the light-emitting layer.

8. A method of manufacturing a color-converting filter substrate, comprising the steps of:
preparing a transparent supporting substrate;
forming, in a desired pattern on the supporting substrate, at least one color-converting filter layer formed of a resin film containing fluorescent colorant;
forming a transparent polymeric film layer for covering the color-converting filter layers to form a flat surface;
forming one transparent inorganic film layer on the polymeric film layer, and for a wavelength λ in a range from 450 nm to 500 nm inclusive, said inorganic film layer having a film thickness d that satisfies a relationship $$nd=s\lambda/2,$$

wherein n is a refractive index to light of wavelength λ, and s is a natural number; and
forming a transparent electrode layer in at least one electrically independent region on the inorganic film layer, the transparent electrode layer having a refractive index higher than that of the inorganic film layer.

9. A method of manufacturing a color-converting filter substrate, comprising the steps of:
preparing a transparent supporting substrate;
forming, in a desired pattern on the supporting substrate, at least one color-converting filter layer formed of a resin film containing fluorescent colorant;
forming a transparent polymeric film layer for covering the color-converting filter layers to form a flat surface;
forming a transparent inorganic film layer having a thickness d on the polymeric film layer; and
forming transparent electrode layer in at least one electrically independent region on the inorganic film layer, the transparent electrode layer having a refractive index higher than that of the inorganic film layer;

wherein the inorganic film layer is constituted from a laminate of at least two inorganic film layers, and for a wavelength λ in a range from 450 nm to 500 nm inclusive, a refractive index of the inorganic film layer adjacent to the transparent electrode layer is lower than a refractive index of the transparent electrode layer, and refractive indices and thicknesses of $(2p-1)^{th}$ and $2p^{th}$ inorganic film layers, which are counted from the transparent electrode layer starting from the $(2p-1)^{th}$ layer, wherein p is a natural number, satisfy relationships $n_{2p-1} > n_{2p}$, $n_{2p-1}d_{2p-1} = s_{2p-1}\lambda/2$, and $n_{2p}d_{2p} = s_{2p}\lambda/4$, wherein n is a refractive index of one inorganic film layer, d is a thickness of the one inorganic film layer, and s is a natural number.

10. A method of manufacturing a color-converting filter substrate according to claim 9, wherein for the wavelength λ in the range from 450 nm to 500 nm inclusive, refractive indexes of the inorganic film layers become gradually lower from the transparent electrode layer toward the polymeric film layer.

11. A method of manufacturing a color-converting filter substrate, comprising the steps of:

preparing a transparent supporting substrate;

forming, in a desired pattern on the supporting substrate, at least one color-converting filter layer formed of a resin film containing fluorescent colorant;

forming a transparent polymeric film layer for covering the color-converting filter layer to form a flat surface;

forming a transparent inorganic film layer having a thickness d on the polymeric film layer; and forming transparent electrode layer in at least electrically independent region on the inorganic film layer, the transparent electrode layer having a refractive index higher than that of the inorganic film layer;

wherein the inorganic film layer is constituted from a laminate of at least two inorganic film layers, and for a wavelength λ in a range from 450 nm to 500 nm inclusive, a refractive index of the inorganic film layer adjacent to the transparent electrode layer is lower than a refractive index of the transparent electrode layer, and refractive indices and thicknesses of $(2p-1)^{th}$ and $2p^{th}$ inorganic film layers, which are counted from the transparent electrode layer starting from the $(2p-1)^{th}$ layer, wherein p is a natural number, satisfy relationships $n_{2p-1} > n_{2p}$, $n_{2p-1}d_{2p-1} = s_{2p-1}\lambda/4$, and $n_{2p}d_{2p} = s_{2p}\lambda/2$, wherein n is a refractive index of one inorganic film layer, d is a thickness of the one inorganic film layer, and s is a natural number.

12. A method of manufacturing a color-converting filter substrate, comprising the steps of:

preparing a transparent supporting substrate;

forming, in a desired pattern on the supporting substrate, at least one color-converting filter layer formed of a resin film containing fluorescent colorant;

forming a transparent polymeric film layer for covering the color-converting filter layers to form a flat surface;

forming a transparent inorganic film layer on the polymeric film layer to have a composition that changes continuously; and forming a transparent electrode layer in at least one electrically independent region on the inorganic film layer, the transparent electrode layer having a refractive index higher than a refractive index of the inorganic film layer.

13. A method of manufacturing a color conversion type multi-color display, comprising the steps of:

preparing a transparent supporting substrate;

forming, in a desired pattern on the supporting substrate, at least one color-converting filter layer formed of a resin film containing fluorescent colorant;

forming a transparent polymeric film layer for covering the color-converting filter layer to form a flat surface;

forming one transparent inorganic film layer on the polymeric film layer, and for a wavelength λ in a range from 450 nm to 500 nm inclusive, said inorganic film layer having a film thickness d that satisfies a relationship $nd = s\lambda/2$, wherein n is a refractive index to light of the wavelength λ, and s is a natural number;

forming a transparent electrode layer in at least one electrically independent region on the inorganic film layer, the transparent electrode layer having a refractive index higher than that of the inorganic film layer;

forming an organic light-emitting layer containing at least a light-emitting material on the transparent electrode layer; and forming a second electrode layer on the organic light-emitting layer.

14. A method of manufacturing a color conversion type multi-color display, comprising the steps of:

preparing a transparent supporting substrate;

forming, in a desired pattern on the supporting substrate, at least one color-converting filter layer formed of a resin film containing fluorescent colorant;

forming a transparent polymeric film layer for covering the color-converting filter layers to form a flat surface;

forming a transparent inorganic film layer having a thickness d on the polymeric film layer;

forming a transparent electrode layer in at least one electrically independent region on the inorganic film layer, the transparent electrode layer having a refractive index higher than that of the inorganic film layer;

forming an organic light-emitting layer containing at least a light-emitting material on the transparent electrode layer; and forming a second electrode layer on the organic light-emitting layer;

wherein the inorganic film layer is constituted from a laminate of at least two inorganic film layers, and for a wavelength λ in a range from 450 nm to 500 nm inclusive, a refractive index of the inorganic film layer adjacent to the transparent electrode layer is lower than a refractive index of the transparent electrode layer, and refractive indices and thicknesses of $(2p-1)^{th}$ and $2p^{th}$ inorganic film layers, which are counted from the transparent electrode layer starting from the $(2p-1)^{th}$ layer, wherein p is a natural number, satisfy relationships $$n_{2p-1} > n_{2p},$$

$$n_{2p-1}d_{2p-1} = s_{2p-1}\lambda/2, \text{ and}$$

$$n_{2p}d_{2p} = s_{2p}\lambda/4,$$

wherein n is a refractive index of one inorganic film layer, d is a thickness of the inorganic film layer, and s is a natural number.

15. A method of manufacturing a color conversion type multi-color display according to claim 14, wherein for the wavelength λ in the range from 450 nm to 500 nm inclusive, the refractive indexes of the inorganic film layers become gradually lower from the transparent electrode layer toward the polymeric film layer.

16. A method of manufacturing a color conversion type multi-color display, comprising the steps of:

preparing a transparent supporting substrate;

forming, in a desired pattern on the supporting substrate, at least one color-converting filter layer formed of a resin film containing fluorescent colorant;

forming a transparent polymeric film layer for covering the color-converting filter layers to form a flat surface;

forming a transparent inorganic film layer on the polymeric film layer;

forming a transparent electrode layer in at least one electrically independent region on the inorganic film layer, the transparent electrode layer having a refractive index higher than that of the inorganic film layer;

forming an organic light-emitting layer containing at least a light-emitting material on the transparent electrode layer; and forming second electrode layer on the organic light-emitting layer;

wherein the inorganic film layer is constituted from a laminate of at least two inorganic film layers, and for a wavelength λ in a range from 450 nm to 500 nm inclusive, the refractive index of the inorganic film layer adjacent to the transparent electrode layer is lower than a refractive index of the transparent electrode layer, and refractive indices and thicknesses of $(2p-1)^{th}$ and $2p^{th}$ inorganic film layers, which are counted from the transparent electrode layer starting from the $(2p-1)^{th}$ layer, wherein p is a natural number, satisfy the relationships $$n_{2p-1} > n_{2p},$$

$$n_{2p-1}d_{2p-1} = s_{2p-1}\lambda/4, \text{ and}$$

$$n_{2p}d_{2p} = s_{2p}\lambda/2,$$

wherein n is a refractive index of one inorganic film layer, d is a thickness of the one inorganic film layer, and s is a natural number.

17. A method of manufacturing a color conversion type multi-color display, comprising the steps of:

preparing a transparent supporting substrate;

forming, in a desired pattern on the supporting substrate, at least one color-converting filter layer formed of a resin film containing fluorescent colorant;

forming a transparent polymeric film layer for covering the color-converting filter layers to form a flat surface;

forming a transparent inorganic film layer having continuously changed compositions on the polymeric film layer;

forming a transparent electrode layer in at least one electrically independent region on the inorganic film layer, the transparent electrode layer having a refractive index higher than that of the inorganic film layer;

forming an organic light-emitting layer containing at least a light-emitting material on the transparent electrode layer; and forming a second electrode layer on the organic light-emitting layer.

* * * * *

UNITED STATES PATENT AND TRADEMARK OFFICE
CERTIFICATE OF CORRECTION

PATENT NO. : 6,818,328 B2
APPLICATION NO. : 10/368357
DATED : November 16, 2004
INVENTOR(S) : Makoto Utsumi and Koji Kawaguchi It is certified that error appears in the above-identified patent and that said Letters Patent is hereby corrected as shown below:

Column 4, line 33, change "A$\lambda$" to --$\lambda$--;

Column 4, line 48, change "A" to --$\lambda$--;

Column 5, line 33, change "substrate" to --substrates--;

Column 7, line 42, change "A" to --$\lambda$--;

Column 16, line 60, change "$O_2$" to --$O^2$--;

Column 19, line 6, new paragraph start after "device";

Column 24, line 25, change "nd=t$\lambda$/2" to --md=t$\lambda$/2--.

Signed and Sealed this

Twelfth Day of February, 2008

JON W. DUDAS
*Director of the United States Patent and Trademark Office*